United States Patent
Lin et al.

(10) Patent No.: US 9,847,402 B2
(45) Date of Patent: Dec. 19, 2017

(54) METHOD OF USING POLYSILICON AS STOP LAYER IN A REPLACEMENT METAL GATE PROCESS

(71) Applicant: UNITED MICROELECTRONICS CORP., Hsin-Chu (TW)

(72) Inventors: Chao-Hung Lin, Changhua County (TW); Shih-Hung Tsai, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/666,591

(22) Filed: Aug. 2, 2017

(65) Prior Publication Data

US 2017/0330956 A1 Nov. 16, 2017

Related U.S. Application Data

(63) Continuation of application No. 15/161,294, filed on May 23, 2016, now Pat. No. 9,761,692.

(30) Foreign Application Priority Data

Apr. 22, 2016 (TW) .............................. 105112577 A

(51) Int. Cl.
| | |
|---|---|
| H01L 21/3213 | (2006.01) |
| H01L 29/66 | (2006.01) |
| H01L 21/8238 | (2006.01) |
| H01L 27/092 | (2006.01) |

(52) U.S. Cl.
CPC .................. *H01L 29/66545* (2013.01); *H01L 21/823828* (2013.01); *H01L 21/823857* (2013.01); *H01L 27/092* (2013.01)

(58) Field of Classification Search
CPC ...................... H01L 21/32139; H01L 29/6659
USPC .......................................................... 438/585
See application file for complete search history.

(56) References Cited

U.S. PATENT DOCUMENTS

| | | | |
|---|---|---|---|
| 7,074,680 B2 | 7/2006 | Doczy et al. | |
| 7,531,404 B2 | 5/2009 | Pae et al. | |
| 2013/0168816 A1* | 7/2013 | Kang | ...................... H01L 28/24 257/536 |
| 2015/0069534 A1* | 3/2015 | Ke | ...................... H01L 29/4966 257/411 |
| 2015/0076623 A1* | 3/2015 | Tzou | ............... H01L 21/823842 257/407 |

(Continued)

OTHER PUBLICATIONS

Chang, Title of Invention: Method for Modulating Work Function of Semiconductor Device Having Metal Gate Structure by Gas Treatment, U.S. Appl. No. 14/880,693, filed Oct. 12, 2015.

*Primary Examiner* — Jami M Valentine
(74) *Attorney, Agent, or Firm* — Winston Hsu

(57) ABSTRACT

A method for fabricating semiconductor device includes the steps of: providing a substrate, wherein the substrate comprises a first region and a second region; forming a high-k dielectric layer on the first region and the second region; forming a first bottom barrier metal (BBM) layer on the high-k dielectric layer of the first region and the second region; forming a stop layer on the first region and the second region; removing the stop layer on the second region; and forming a second BBM layer on the first region and the second region.

7 Claims, 5 Drawing Sheets

(56) References Cited

U.S. PATENT DOCUMENTS

| 2015/0214060 A1* | 7/2015 | Ke | H01L 29/4966 |
| | | | 438/287 |
| 2016/0126139 A1* | 5/2016 | Yang | H01L 29/4966 |
| | | | 257/392 |

* cited by examiner

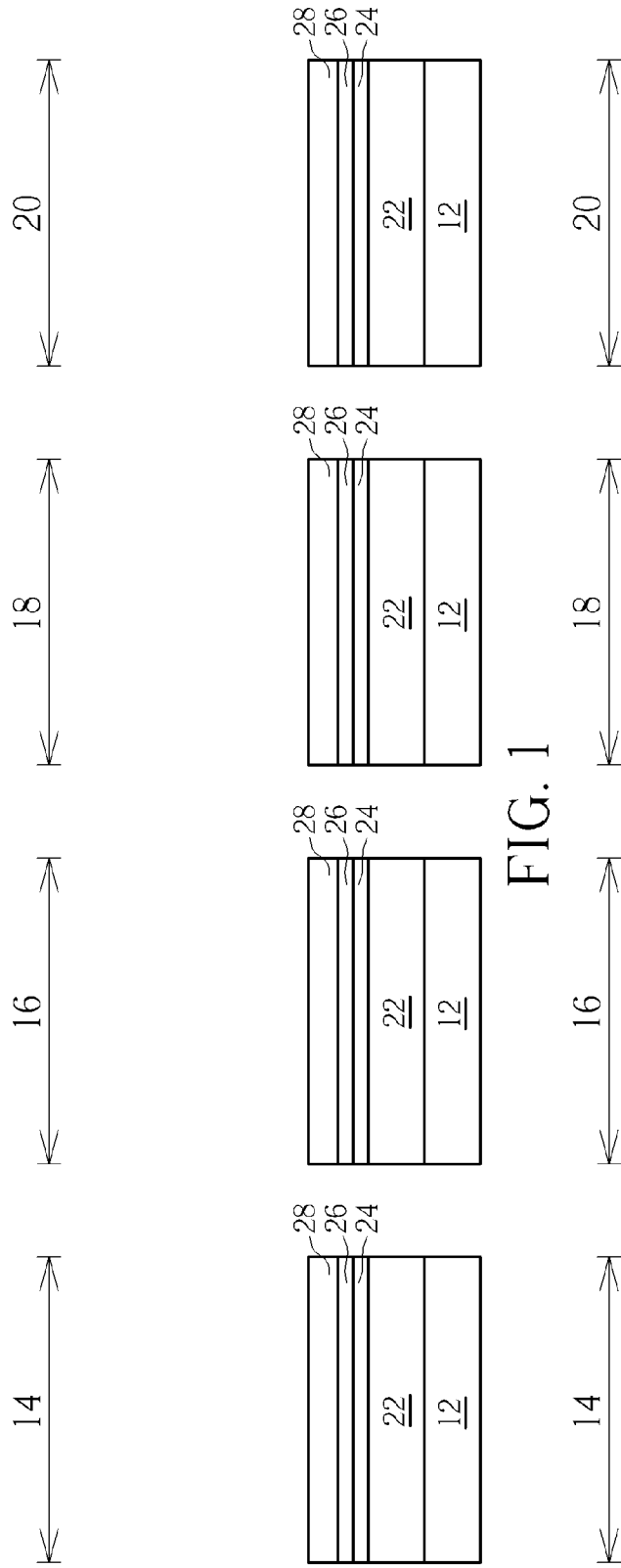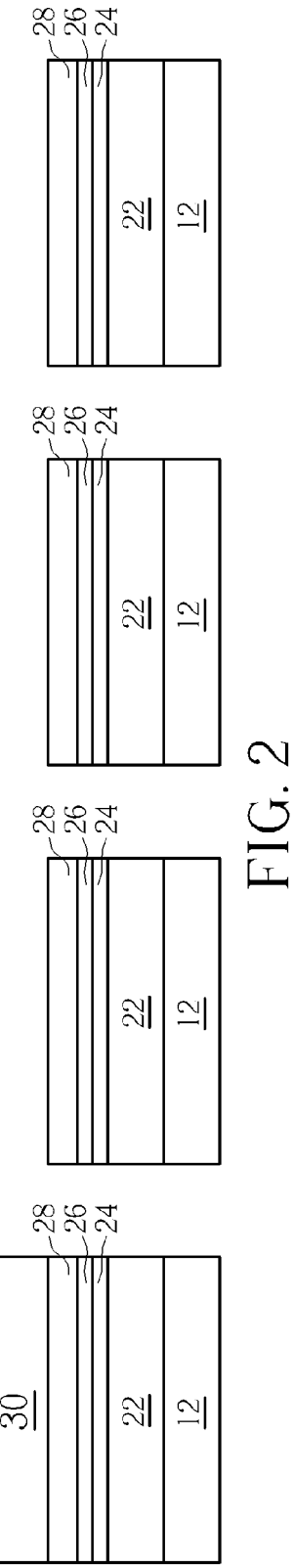

METHOD OF USING POLYSILICON AS STOP LAYER IN A REPLACEMENT METAL GATE PROCESS

CROSS REFERENCE TO RELATED APPLICATIONS

This is a continuation application of U.S. patent application Ser. No. 15/161,294, filed on May 23, 2016, and all benefits of such earlier application are hereby claimed for this new continuation application.

BACKGROUND OF THE INVENTION

1. Field of the Invention

The invention relates to a method for fabricating semiconductor device, and more particularly to a method of using polysilicon as stop layer in a replacement metal gate (RMG) process.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistor, voids are often formed during the deposition of work function metal layer for fabricating multi-VT devices and affect the performance of the device substantially. Hence, how to resolve this issue has become an important task in this field.

SUMMARY OF THE INVENTION

According to an embodiment of the present invention, a method for fabricating semiconductor device includes the steps of: providing a substrate, wherein the substrate comprises a first region and a second region; forming a high-k dielectric layer on the first region and the second region; forming a first bottom barrier metal (BBM) layer on the high-k dielectric layer of the first region and the second region; forming a stop layer on the first region and the second region; removing the stop layer on the second region; and forming a second BBM layer on the first region and the second region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 illustrate a method for fabricating a semiconductor device according to a preferred embodiment of the present invention.

DETAILED DESCRIPTION

Figure 3:
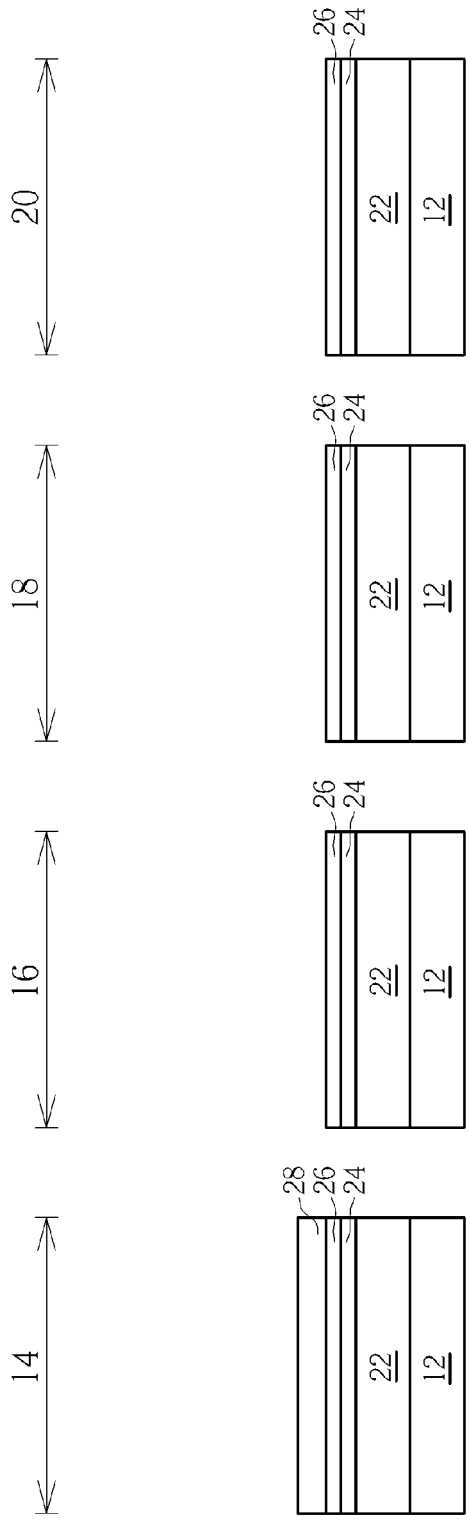

Referring to FIGS. 1-9, FIGS. 1-9 illustrate a method for fabricating a semiconductor device according to a preferred embodiment of the present invention. As shown in FIG. 1, a substrate 12, such as a silicon substrate or silicon-on-insulator (SOI) substrate is provided, and four transistor regions, including a first region 14, a second region 16, a third region 18, and a fourth region 20 are defined on the substrate 12. In this embodiment, the four regions 14, 16, 18, 20 are defined to fabricate gate structures adapted for different threshold voltages in the later process, in which the first region 14 and second region 16 preferably share same conductive type, such as both being NMOS regions, and the third region 18 and fourth region 20 share same conductive type, such as both being PMOS regions. More specifically, the first region 14 is preferably used to prepare a medium low voltage threshold (mLVT) NMOS transistor device, the second region 16 is used to prepare a standard voltage threshold (SVT) NMOS transistor device, the third region 18 is used to prepare a SVT PMOS transistor device, and the fourth region 20 is used to prepare a mLVT PMOS transistor device.

In this embodiment, at least a fin-shaped structure 22 is formed on the substrate 12, and the bottom of the fin-shaped structure 22 is surrounded by a shallow trench isolation (STI) (not shown) composed of silicon oxide. It should be noted that even though this embodiment pertains to a FinFET process, it would also be desirable to apply the process of this embodiment to a non-planar MOS transistor, which is also within the scope of the present invention.

The fin-shaped structure 22 of this embodiment is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 22 of this embodiment could also be obtained by first forming a patterned mask (not shown) on the substrate, 12, and through an etching process, the pattern of the patterned mask is transferred to the substrate 12 to form the fin-shaped structure 22. Moreover, the formation of the fin-shaped structure 22 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 22. These approaches for forming fin-shaped structure 22 are all within the scope of the present invention.

Next, a selective interfacial layer (not shown) and a high-k dielectric layer 24 are formed on the fin-shaped structure 22 on the first region 14, second region 16, third region 18, and fourth region 20, and a first bottom barrier metal (BBM) layer 26 is formed on the high-k dielectric layer 24 on first region 14, second region 16, third region 18, and fourth region 20. Next, ammonia ($NH_3$) could be used to selectively conduct a soak process, and an anneal process could be carried out thereafter.

Next, a stop layer 28 is formed on the first BBM layer 26 on first region 14, second region 16, third region 18, and fourth region 20, and a selective anneal process is conducted to drive-in the ammonia gas injected earlier.

In this embodiment, the interfacial layer is preferably composed of $SiO_2$, SiN, SiON, or other high-k dielectric material. The first BBM layer 26 could be selected from the group consisting of TiN and TaN, but not limited thereto. The stop layer 28 could be selected from the group consisting of germanium, polysilicon, and amorphous silicon, and most preferably amorphous silicon, but not limited thereto.

In this embodiment, the high-k dielectric layer 24 is preferably selected from dielectric materials having dielectric constant (k value) larger than 4. For instance, the high-k dielectric layer 24 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, as shown in FIG. 2, a first patterned mask 30, such as a patterned resist is formed on the stop layer 28 on first region 14.

Next, as shown in FIG. 3, an etching process is conducted by using the patterned mask 30 as mask to remove the stop layer 28 on the second region 16, the third region 18, and the fourth region 20 and expose the first BBM layer 26 underneath. The first patterned mask 30 is then removed to expose the stop layer 28 underneath.

Figure 4:
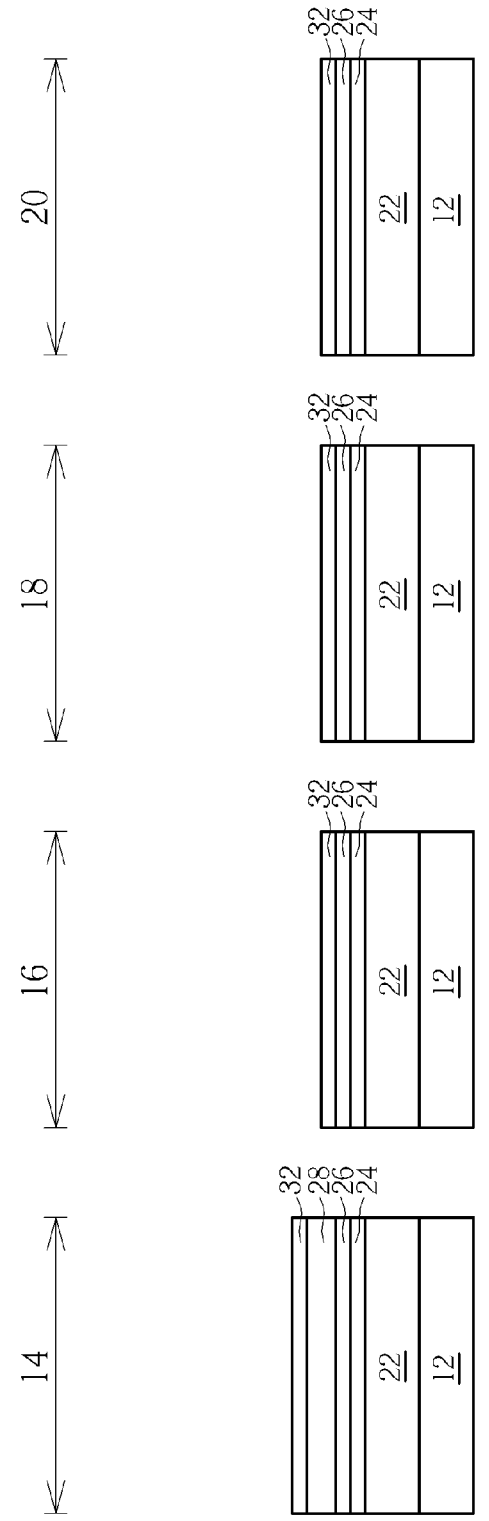

Next, as shown in FIG. 4, a second BBM layer 32 is formed on the stop layer 28 on first region 14 and the first BBM layer 26 on second region 16, third region 18, and fourth region 20, in which the second BBM layer 32 could be selected from the group consisting of TiN and TaN, but not limited thereto.

Figure 5:
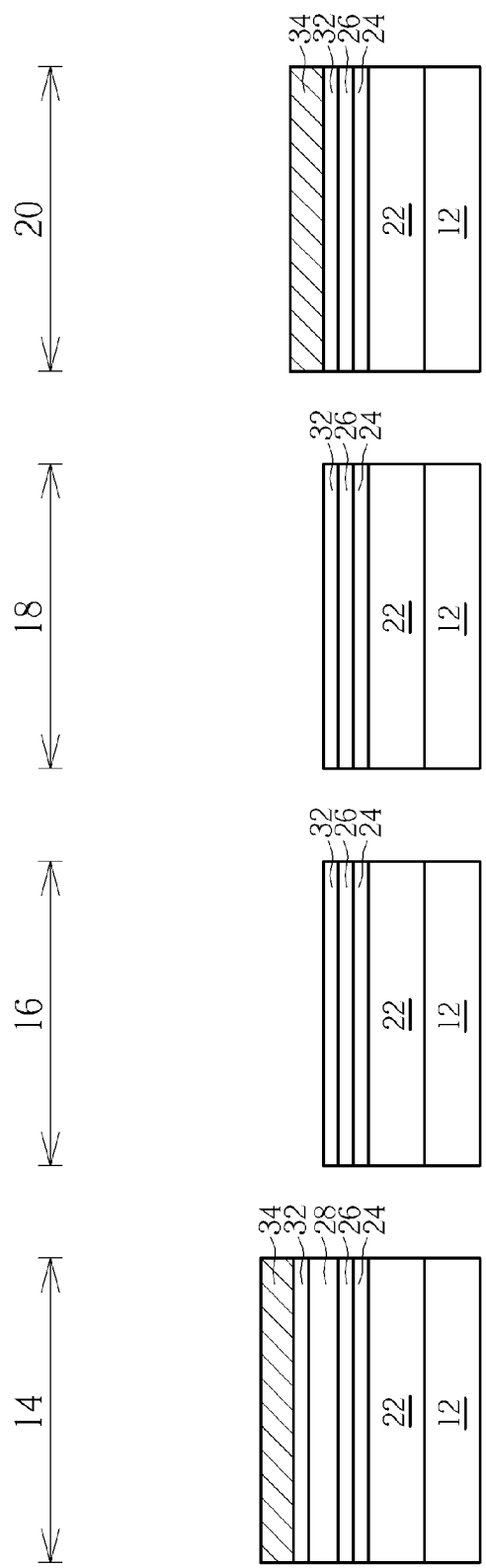

Next, as shown in FIG. 5, a first work function metal layer 34 is formed on the first region 14 and the fourth region 20. In this embodiment, the formation of the first work function metal layer 34 could be accomplished by first depositing a first work function metal layer 34 on the surface of the second BBM layer 32 on first region 14, second region 16, third region 18, and fourth region 20, and then conducting a photo-etching process to remove the first work function metal layer 34 on second region 16 and third region 18 so that the first work function metal layer 34 remains only on the second BBM layer 32 on first region 14 and fourth region 20.

In this embodiment, the first work function metal layer 34 is preferably a p-type work function metal layer, which preferably has a work function ranging between 4.8 eV and 5.2 eV and may be selected from the group consisting of titanium nitride (TiN), tantalum nitride (TaN), and tantalum carbide (TaC), and most preferably TiN, but is not limited thereto.

Figure 6:
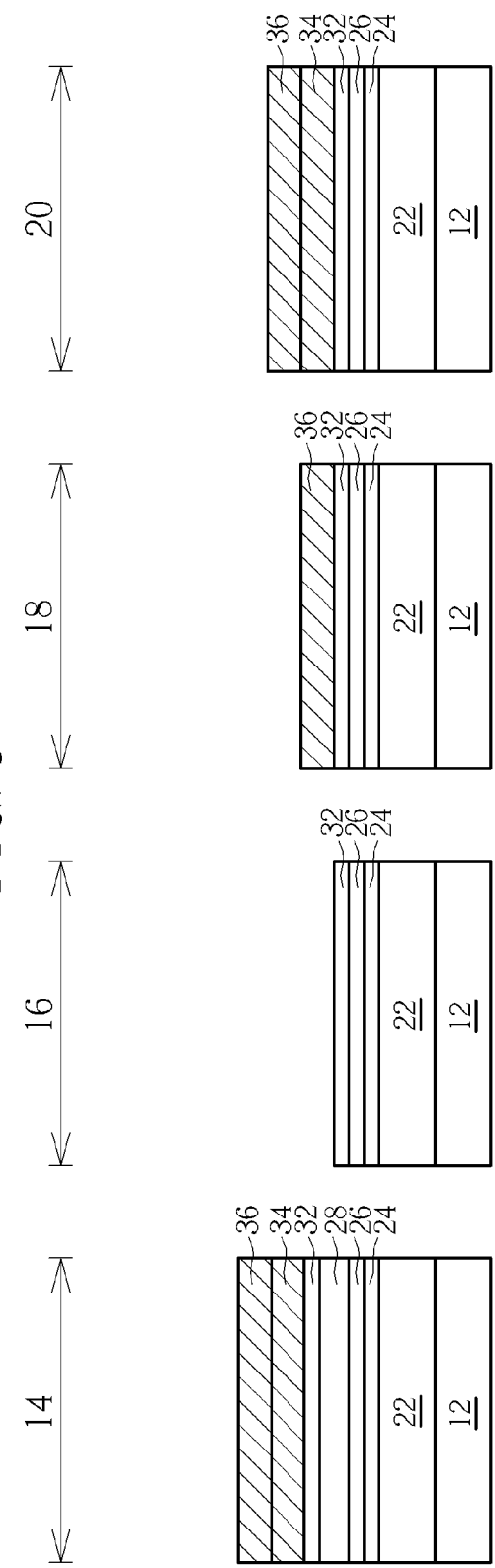

Next, as shown in FIG. 6, a second work function metal layer 36 is formed on the first region 14, the third region 18, and the fourth region 20. In this embodiment, the formation of the second work function metal layer 36 could be accomplished by first depositing a second work function metal layer 36 on the first work function metal layer 34 on first region 14 and fourth region 20 and the second BBM layer 32 on second region 16 and third region 18, and then conducting a photo-etching process to remove the second work function metal layer 36 on second region 16 so that the second work function metal layer 36 remains only on the first work function metal layer 34 on first region 14, the second BBM layer 32 on third region 18, and the first work function metal layer 34 on fourth region 20.

Similar to the first work function metal layer 34, the second work function metal layer 36 is preferably a p-type work function metal layer, in which the first work function metal layer 34 and the second work function metal layer 36 may be composed of the same material or different material. The second work function metal layer 36 preferably has a work function ranging between 4.8 eV and 5.2 eV and may be selected from the group consisting of titanium nitride (TiN), tantalum nitride (TaN), and tantalum carbide (TaC), and most preferably TiN, but is not limited thereto.

Figure 7:
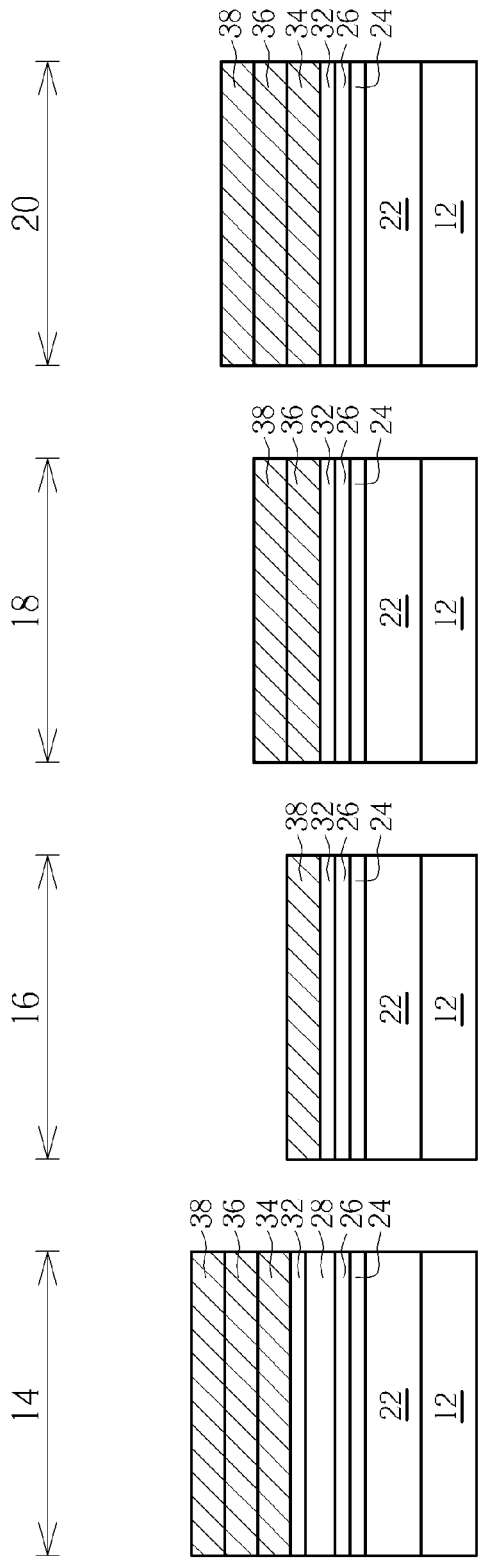

Next, as shown in FIG. 7, a third work function metal layer 38 is formed on the first region 14, the second region 16, the third region 18, and the fourth region 20. Specifically, the formation of the third work function metal layer 38 is preferably accomplished by depositing a third work function metal layer 38 on the second work function metal layer 36 on first region 14, the second BBM layer 32 on second region 16, the second work function metal layer 36 on third region 18, and the second work function metal layer 36 on fourth region 20.

Figure 8:
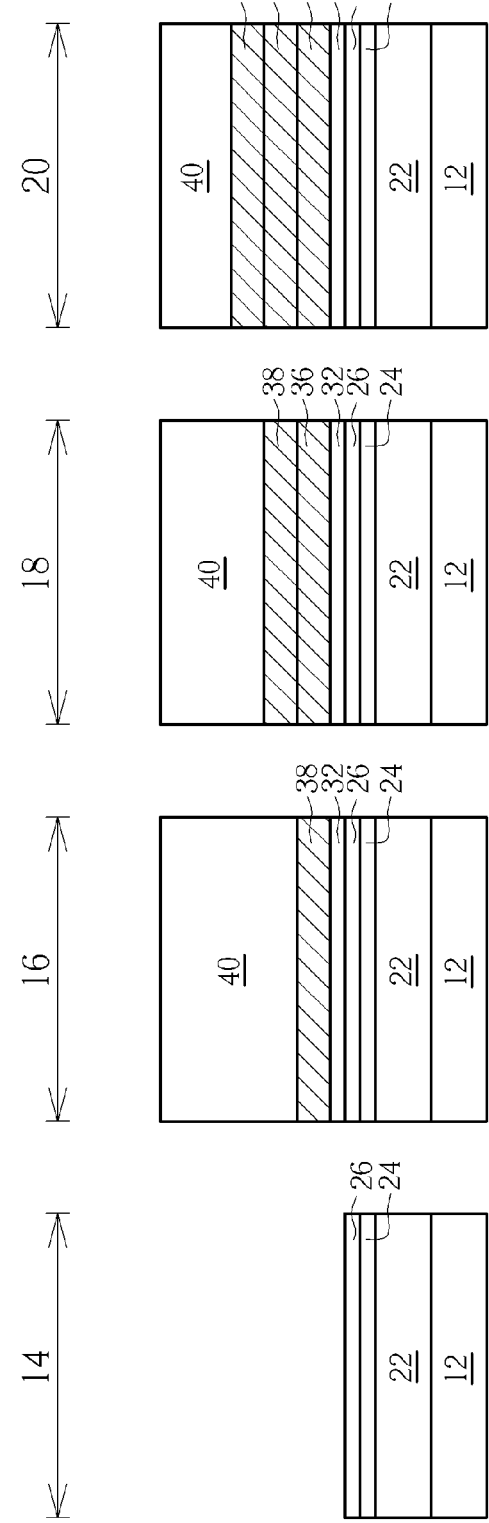

Next, as shown in FIG. 8, a second patterned mask 40 is formed to cover the second region 16, the third region 18, and the fourth region 20, and an etching process is conducted by using the second patterned mask 40 to remove the third work function metal layer 38, the second work function metal layer 36, the first work function metal layer 34, the second BBM layer 32, and the stop layer 28 on the first region 14 and expose the first BBM layer 26 underneath.

Preferably, it would be desirable to first use agent such as Standard Clean 2 (SC2) to remove the third work function metal layer 38, the second work function metal layer 36, and the first work function metal layer 34 on first region 14 and stop on the second BBM layer 32, and then use agent such as Standard Clean 1 (SC1) to remove the second BBM layer 32 on first region 14 and stop on the stop layer 28. Next, alkaline etchant solution such as ammonium hydroxide ($NH_4OH$) or tetramethylammonium hydroxide (TMAH) is used to completely remove the stop layer 28 and stop on the first BBM layer 26.

Figure 9:
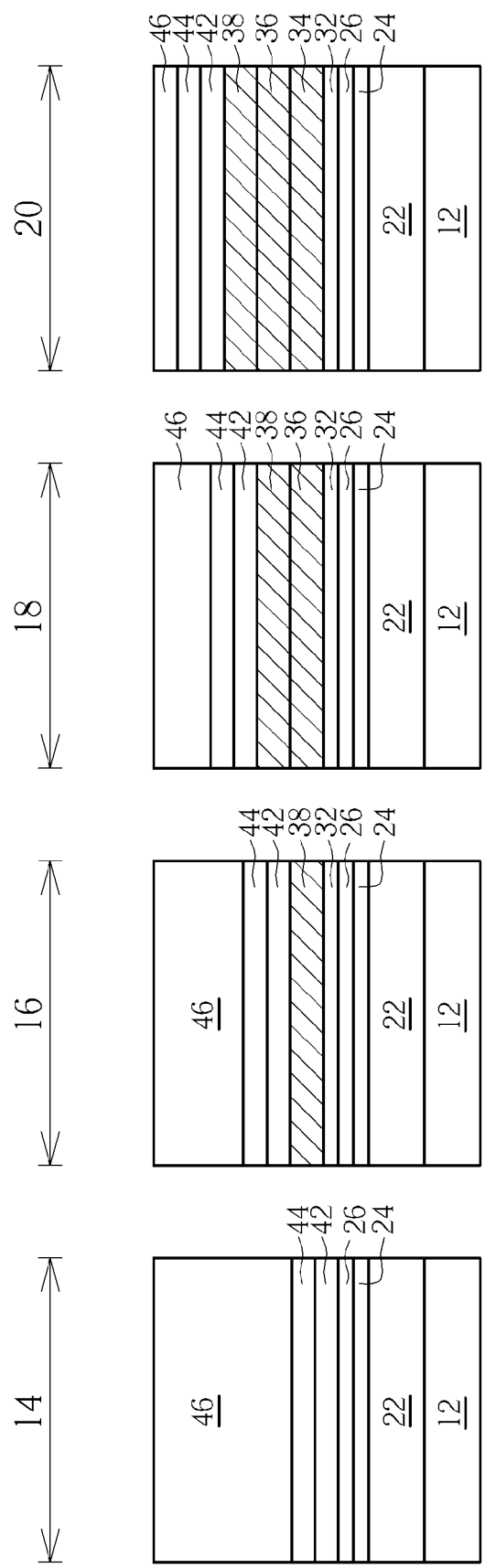

Next, as shown in FIG. 9, the second patterned mask 40 is removed from the second region 16, the third region 18, and the fourth region 20, and a fourth work function metal layer 42, a third BBM layer 44, and a low resistance metal layer 46 are deposited on the first region 14, the second region 16, the third region 18, and the fourth region 20. This forms a metal gate on each of the first region 14, the second region 16, the third region 18, and the fourth region 20 and completes the fabrication of a semiconductor device according to a preferred embodiment of the present invention.

In this embodiment, the fourth work function metal layer 42 is preferably a n-type work function metal layer, which preferably has a work function ranging between 3.9 eV and 4.3 eV and may be selected from the group consisting of titanium aluminide (TiAl), zirconium aluminide (ZrAl), tungsten aluminide (WAl), tantalum aluminide (TaAl), hafnium aluminide (HfAl), and titanium aluminum carbide (TiAlC), but it is not limited thereto. The third BBM layer 44 could be composed of same material or different material from the second BBM layer 32 and first BBM layer 26, in which the third BBM layer 44 could be selected from the group consisting of TiN and TaN, but not limited thereto. The low resistance metal layer 46 could be selected from the group consisting of Cu, Al, W, TiAl, and CoWP.

It should be noted that the aforementioned process of forming the high-k dielectric layer 24 in FIG. 1 to the step of forming low resistance metal layer 46 in FIG. 9 could also be applied to typical gate first process from high-k first process, gate last process from high-k first process, and high-k last process of the RMG process. Since the process of using RMG process to transform dummy gate into metal gate is well known to those skilled in the art, the details of which are not explained herein for the sake of brevity.

Overall, the present invention preferably forms a stop layer composed of amorphous silicon between a first BM layer and a second BBM layer of one of the gate structure during the fabrication of a device having multi-VT gate structures, in which the gate structure including such stop layer according to the aforementioned embodiment being gate structure of a mLVT NMOS transistor. By doing so, it would be desirable to use the stop layer as a blocking or protecting layer during the etching process of work function metal layers and the second BBM layer so that the first BBM layer could be protected from etchant such as SC1 and the overall thickness of the first BBM layer and the performance of the device could be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate, wherein the substrate comprises a first region and a second region;
   forming a high-k dielectric layer on the first region and the second region;
   forming a first bottom barrier metal (BBM) layer on the high-k dielectric layer of the first region and the second region;
   forming a stop layer on and directly contacting the first BBM layer on the first region and the second region;
   removing the stop layer on the second region; and
   forming a second BBM layer on the stop layer on the first region and the first BBM layer on the first region and the second region.

2. The method of claim 1, further comprising:
   forming a first patterned mask on the stop layer on the first region;
   removing the stop layer on the second region; and
   forming the second BBM layer on the stop layer on the first region and the first BBM layer on the first region and the second region.

3. The method of claim 2, further comprising:
   forming a first work function metal layer on the first region;
   forming a second work function metal layer on the first region;
   forming a third work function metal layer on the first region and the second region;
   forming a second patterned mask on the second region; and
   removing the third work function metal layer, the second work function metal layer, the first work function metal layer, the second BBM layer, and the stop layer on the first region.

4. The method of claim 3, wherein the first work function metal layer, the second work function metal layer, and the third work function metal layer comprise the same conductive type.

5. The method of claim 1, wherein each of the first region and the second region comprises a NMOS region.

6. The method of claim 1, wherein the stop layer is selected from the group consisting of germanium, polysilicon, and amorphous silicon.

7. The method of claim 1, wherein the first BBM layer and the second BBM layer comprise different material.

* * * * *